United States Patent
Teramoto et al.

(10) Patent No.: US 8,420,539 B2
(45) Date of Patent: Apr. 16, 2013

(54) ADDITIVE FOR POLISHING COMPOSITION

(75) Inventors: Masashi Teramoto, Kyotanabe (JP);
Ryoko Higashigaki, Kyotanabe (JP);
Hiroshi Makino, Kyotanabe (JP)

(73) Assignee: Nitta Haas Incorporated, Osaka (JP)

( * ) Notice: Subject to any disclaimer, the term of this patent is extended or adjusted under 35 U.S.C. 154(b) by 0 days.

(21) Appl. No.: 13/442,125

(22) Filed: Apr. 9, 2012

(65) Prior Publication Data

US 2012/0193573 A1   Aug. 2, 2012

Related U.S. Application Data

(63) Continuation of application No. 12/449,242, filed as application No. PCT/JP2007/068673 on Sep. 26, 2007, now Pat. No. 8,308,972.

(30) Foreign Application Priority Data

Jan. 31, 2007   (JP) ................................. 2007-022441

(51) Int. Cl.
*C09K 13/00*   (2006.01)
(52) U.S. Cl.
USPC ........................................ 438/692; 252/79.1
(58) Field of Classification Search .................. None
See application file for complete search history.

(56) References Cited

U.S. PATENT DOCUMENTS

| | | | |
|---|---|---|---|
| 6,362,103 B1 * | 3/2002 | Watts | 438/691 |
| 6,461,958 B1 * | 10/2002 | Zhang et al. | 438/626 |
| 6,750,145 B2 * | 6/2004 | Crevasse et al. | 438/692 |
| 2004/0098924 A1 * | 5/2004 | Iwasa | 51/302 |

FOREIGN PATENT DOCUMENTS

| | | |
|---|---|---|
| JP | 02/257627 | 10/1990 |
| JP | 07-100738 | 4/1995 |
| JP | 10-172935 | 6/1998 |
| JP | 2002-75929 | 3/2002 |
| JP | 2002-252189 | 9/2002 |
| JP | 2004-335722 | 11/2004 |

OTHER PUBLICATIONS

JPO, NOtification of Reasons for Refusal Patent Application No. 2007-022441, Nov. 30, 2012.*
JPO, Machine Translation JP,2002-075929,A, Dec. 27, 2012.*

* cited by examiner

*Primary Examiner* — Binh X Tran
*Assistant Examiner* — David Cathey, Jr.
(74) *Attorney, Agent, or Firm* — Clark & Brody

(57) ABSTRACT

The invention relates to an additive for polishing composition, which can ensure stable polishing properties. The additive for polishing composition contains one or more amine compounds and an alcohol. The one or more amine compounds contain a quaternary ammonium salt. When the one or more amine compounds are contained in high concentration, the occurrence of precipitation of the amine compound can be prevented by including the alcohol.

4 Claims, 4 Drawing Sheets

PIPERAZINE PRECIPITATE

ADDITIVE FOR POLISHING COMPOSITION

TECHNICAL FIELD

The present invention relates to an additive for polishing composition added to a polishing composition which is used at least once.

BACKGROUND ART

A silicon wafer polishing by a chemical mechanical polishing (CMP) ensures a high-accuracy flattening by a multistage-polishing having three or four stages. A primary polishing performed in a first stage and a secondary polishing performed in a second stages aim mainly to flatten the surface of the silicon wafer and, therefore, require a high polishing rate.

In the primary polishing and some of the secondary polishing, the polishing composition slurry is generally used cyclically and repeatedly. However, the repeated use of slurry leads to the decrease of pH and polishing properties of slurry. In particular, the polishing rate is decreased remarkably. Thus, it is necessary that a slurry which is degraded in properties to a certain degree is replaced with new slurry, which causes a problem such as interruption of processes for the replacement and increase in costs.

In order to prevent the decrease of the polishing properties such as a polishing rate without the replacing operations, it is effective to occasionally add an inorganic alkali solution such as potassium hydroxide or sodium hydroxide or add new slurry itself, to the circulating slurry.

In addition, polishing solution for a semiconductor wafer disclosed in Japanese Unexamined Patent Publication JP-A 2002-252189 is used when performing the polishing with a polishing tool in which abrasive grains are fixed. Moreover, as the polishing solution, a mixture of sodium hydroxide or potassium hydroxide with sodium carbonate or potassium carbonate is used.

By adding the inorganic alkali solution such as potassium hydroxide or sodium hydroxide or by adding new slurry itself, it is possible to prevent the decrease of an average polishing rate after performing the polishing more than once. However, there is a problem that the polishing rate varies widely before and after the addition of them.

DISCLOSURE OF THE INVENTION

An object of the invention is to provide an additive for polishing composition, which can ensure stable polishing properties.

The invention provides an additive for polishing composition, comprising one or more amine compounds and an alcohol, the additive being added to a polishing composition used at least once.

Furthermore, in the invention, it is preferable that the additive comprises two or more amine compounds, and the two or more amine compounds comprise a quaternary ammonium salt and one or more amine compounds selected from among soluble or water dispersible primary amine compounds, secondary amine compounds, tertiary amine compounds and polymers having amino groups in a main or side chain thereof.

Furthermore, in the invention, it is preferable that the additive comprises two or more amine compounds, and the amine compounds comprise a quaternary ammonium salt and a same amine compound as that contained in the polishing composition.

Furthermore, in the invention, it is preferable that the quaternary ammonium salt is tetramethylammonium hydroxide.

Furthermore, in the invention, it is preferable that the alcohol comprises one or more selected from among aliphatic saturated alcohols.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
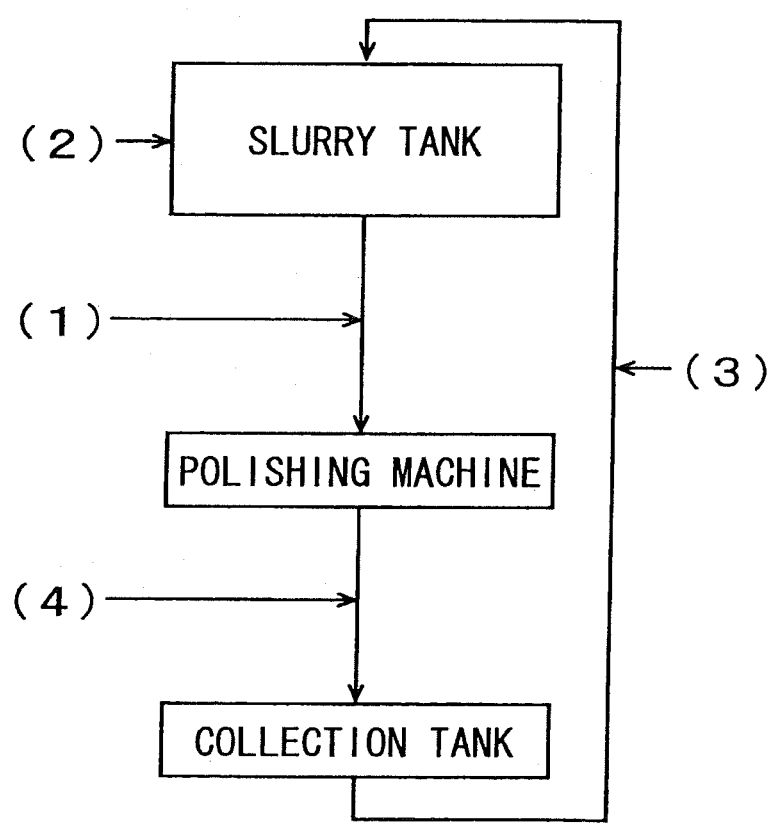
FIG. 1 is a view showing a timing of addition in a case of a cyclic usage.

Now referring to the drawings, preferred embodiments of the invention are described below.

The invention provides an additive for polishing composition added to a polishing composition (slurry) used at least once. The additive for polishing composition according to the invention comprises one or more amine compounds and an alcohol, and it is preferable that the amine compounds contain a quaternary ammonium salt.

For instance, in a case of a cyclic usage in which a slurry used once is collected and reused under the same conditions or with the same polishing machine, and in a case of a multistage usage in which a slurry used once is collected and reused more than once under other conditions or with other polishing machines, it is possible to prevent the decrease and the variation of polishing properties by adding the additive according to the invention to the slurry.

It is preferable that the additive comprises one or more amine compounds. When the additive comprises one amine compound only, it is preferable that the amine compound is strongly alkaline quaternary ammonium salt such as tetramethylammonium hydroxide (TMAH).

When the additive comprises two or more amine compounds, it is preferable to use quaternary ammonium salt and, other than the quaternary ammonium salt, one or more compounds selected from among soluble or water dispersible primary amine compounds, secondary amine compounds, tertiary amine compounds and polymers having amino groups in a main or side chain thereof such as polyalkylene imine. More specifically, examples of the amine compound include ammonia, choline, monoethanol amine, aminoethyl ethanol amine, aminoethyl piperazine, and polyethylene imine; and in particular, piperazine is preferable.

Furthermore, when the polishing composition contains the amine compound previously, it is preferable that the additive contains a same amine compound as that contained in the polishing composition.

Accordingly, when the polishing composition contains amine compound previously, it is particularly preferable that the additive contains quaternary ammonium salt only as the amine compound; or quaternary ammonium salt and the same amine compound as that contained in the polishing composition.

Since the additive is added to the polishing composition in use, the polishing composition is diluted and the concentration of abrasive grains is decreased. In order to suppress the influence of the dilution caused by adding the additive, it is necessary to reduce the quantity of the additive. Thus, it is preferable that the additive contains the amino compounds in concentration as high as possible. On the other hand, extremely high concentration of the additive causing colloidal silica of the abrasive grains to coagulate immediately or to dissolve are not adequate upon adding high concentration of amine compound solution to the polishing composition.

For instance, in a case of TMAH among the quaternary ammonium compounds, preferable concentration is 1 to 20% by weight with respect to a total quantity of the additive. In addition, when the additive contains an amine compound which is in a solid state at room temperature, for instance, in the case of piperazine, a concentration range of 1 to 10% by weight is preferable.

When the additive contains an amine compound in high concentration in view of prevention of the dilution, the amine compound may precipitate at room temperature and at low temperature. Obviously, the precipitation of the amine compound should be avoided.

In the case of the amine compound, even if its concentration is one dissolvable at room temperature, the precipitation of the amine compound occurs when a temperature of a machine being in use itself becomes low in winter or a temperature of the additive becomes low during transportation or storage. In that case, the precipitated amine compound is hard to dissolve again even when the temperature is increased. Accordingly, once the precipitation occurs, for example, the machine is stopped so that the polishing composition is removed and replaced, which has a considerable influence on time, effort and cost.

Thus, the additive for polishing composition according to the invention is quite characterized by containing an alcohol.

By containing an alcohol, even if the additive contains the amine compound in high concentration, the precipitation of the amine compound can be prevented. Furthermore, even when the precipitation occurs due to the decrease in solution temperature, the amine compound precipitate immediately dissolves again upon the increase of the temperature.

As the alcohol contained in the additive for polishing composition according to the invention, one or more selected from among aliphatic saturated alcohols may be used; preferably methanol, ethanol, propanol and butanol, and more preferably, methanol and ethanol.

The concentration of the alcohols in the additive for polishing composition is 0.5 to 10.0% by weight. When the concentration of the alcohols is less than 0.5% by weight, it is difficult to suppress the precipitation of the amine compound of high concentration. When the concentration of the alcohols is higher than 10.0% by weight, this leads to the decrease of a polishing rate due to the excessive quantity of the alcohols. In addition, such high concentration of the alcohols leads to the deterioration of safety against fire and work environment due to odor.

Furthermore, it is also possible to prevent metal contamination of a polished wafer by adding an organic acid (chelating agent) to the additive for polishing composition. This organic acid forms a complex in the solution with a metal ion generated in the polishing agent and from a polishing machine/environment. Accordingly, the organic acid has the effect of preventing the metal contamination of the surface and the inside of the polished wafer. The organic acid to be added is selected from among a monocarbonic acid having 2 to 6 carbons, a dicarbonic acid having 2 to 6 carbons, tricarbonic acid having 3 to 6 carbons, and ascorbic acid. Furthermore, as generally called chelating agents, one or more selected from among ethylenediaminetetraacetic acid, hydroxyethylethylenediaminetriacetic acid, diethylenetriaminepentaacetic acid, nitrilotriacetic acid, triethylenetetraminehexaacetic acid, hydroxyethyliminodiacetic acid, dihydroxyethylglycine, ethyleneglycol-bis(β-aminoethyl ether)-N,N'-tetraacetic acid, and 1,2-diaminocyclohexane-N,N,N', N'-tetraacetic acid, may be added. The concentration of the organic acid should depend on the polishing agent, the polishing machine/environment, and required wafer purity, but it is preferably 1 ppm or more and less than 1000 ppm.

As the polishing composition is used in the cyclic and multistage usages, in particular, for a long-term usage, a tiny quantity of the abrasive grains is lost in each polishing batch. This is because, when replacing the wafer in each polishing batch, a polishing composition remaining in the machine is provisionally disposed of together with cleaning pure water. Therefore, for the long-term usage, replenishing the abrasive grains or the polishing composition itself may be needed. In order to avoid the above mentioned replenishment, a tiny quantity of the abrasive grains, which has the same type of the abrasive grains as that contained in the polishing composition, may be added to the additive of the invention, so as to compensate for the lost abrasive grains.

As described above, since the additive for polishing composition contains one or more amine compounds and an alcohol, by adding the additive to the polishing composition used repeatedly more than once, it is possible to prevent the decrease of polishing properties and to reduce the variation of the polishing properties. Furthermore, even when the amine compound is contained in high concentration, the occurrence of precipitation of the amine compound can be prevented. Moreover, even when the precipitation of the amine compound occurs, the precipitate can be immediately dissolved again.

Figure 2:
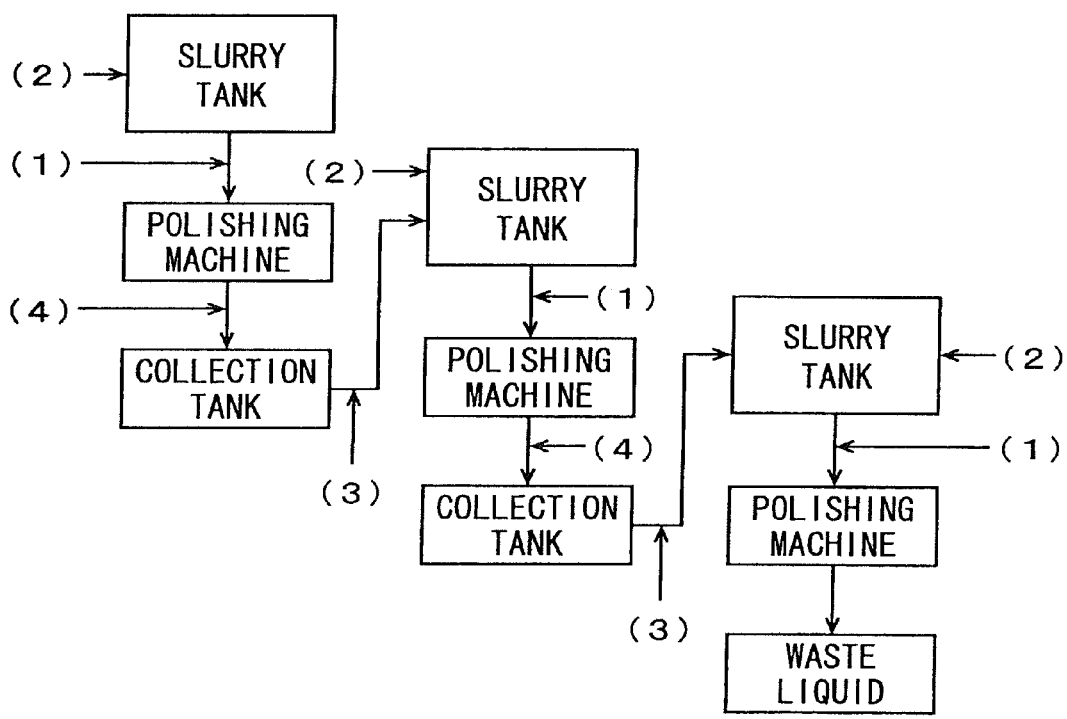
FIG. 2 is a view showing a timing of addition in a case of a multistage usage.

Now, timing for adding the additive for polishing composition to the polishing composition is described below. FIG. 1 is a view showing a timing of addition in the case of the cyclic usage. FIG. 2 is a view showing an addition in the case of the multistage (three-stage) usage. A preferable timing for adding the additive to the polishing composition is, for instance, (1) before supplying the polishing composition to the polishing machine, (2) while the polishing composition is stored in the slurry tank, (3) before returning the collected polishing composition to the slurry tank, and (4) immediately after the completion of the polishing (from the polishing machine to the collection tank). In particular, the timing of (2), that is, while the polishing composition is stored in the slurry tank, is preferable, since the additive is added to the polishing composition directly and, as a consequence, the additive is easily mixed with the polishing composition by being agitated.

It is preferable that the quantity of the additive for polishing composition is properly adjusted so that variation of pH, a composition or a polishing rate of the polishing composition is reduced through monitoring thereof.

EXAMPLES

Hereinbelow, examples and comparative examples of the invention is described.

To begin with, the polishing composition to which the additive for polishing composition is added is described. In the following examples, the polishing composition was diluted when used. The composition shown below is diluted composition, and the rest is water.

(Polishing Composition)

| Abrasive grains: 70 nm colloidal silica particles | 0.30% by weight |
|---|---|
| Polishing accelerator: piperazine | 0.25% by weight |

Additives for polishing composition of examples and comparative examples are as described below.

Comparative Example 1

No additive for polishing composition

Comparative Example 2

| Inorganic alkali: potassium hydroxide | 5.0% by weight |
|---|---|

Example 1

| Amine compound: piperazine | 4.0% by weight |
|---|---|
| Amine compound: tetramethylammonium hydroxide | 15.0% by weight |
| Alcohols: methanol | 1.0% by weight |

Reference Example 1

| Amine compound: piperazine | 4.0% by weight |
|---|---|
| Amine compound: tetramethylammonium hydroxide | 15.0% by weight |

In Comparative Example 1, the additive was not used. In Comparative Example 2, the amine compound was not used, but potassium hydroxide solution was used as the inorganic alkali and the pH of the polishing composition is maintained at 10.6.

In Example 1, as amine compounds, tetramethylammonium hydroxide which is a quaternary ammonium salt and piperazine which is the same amine compound as that contained in the polishing composition, were used and, as an alcohol, methanol was used.

Furthermore, as a Reference Example of a test for precipitation, a composition excluding methanol from that of Example 1 was prepared.

(Evaluation of Polishing Properties)

In evaluating polishing properties, after dummy polishing of 60 minutes duration, 12 batches of polishing of 30 minutes duration each were performed. In order to maintain a constant pH of the polishing composition during the 12 batches of polishing, the additives of Comparative Example 2 and Example 1 were added to a slurry as needed. Thereby, the pH of the polishing compositions was maintained at 10.6. Since the additive was not used in Comparative Example 1, the pH of the polishing composition was not maintained at 10.6, and it varied.

Here, 20-fold dilution of the slurry was prepared and 20 liters of the diluted slurry was used cyclically, and the additive for polishing composition was added when the slurry is stored in the tank.

[Polishing Rate]

A polishing rate can be expressed as a thickness of the wafer removed by polishing per unit time (μm/min). The thickness of the wafer removed by polishing was obtained by measuring a quantity of the decrease in weight of the wafer and then dividing the measured quantity by an area of the polished surface of the wafer.

[Polishing Conditions]

| | |
|---|---|
| Polishing pad: MH-S15A (made by Nitta Haas Incorporated) | |
| Polishing equipment: Strasbaugh 20″ sheet-fed type | |
| Platen rotation speed: 115 rpm | |
| Pressure head rotation speed: 100 rpm | |
| Slurry flow rate: 300 ml/min | |
| Load surface pressure: 30 kPa (300 gf/cm$^2$) | |
| Polishing time: 30 min | |
| Rinsing time: 15 sec | |
| Silicon wafer: 6 inch | |
| Slurry: NP6220 (made by Nitta Haas Incorporated) | |
| pH of slurry: 10.6 (except for Comparative Example 1) | |

Figure 3:
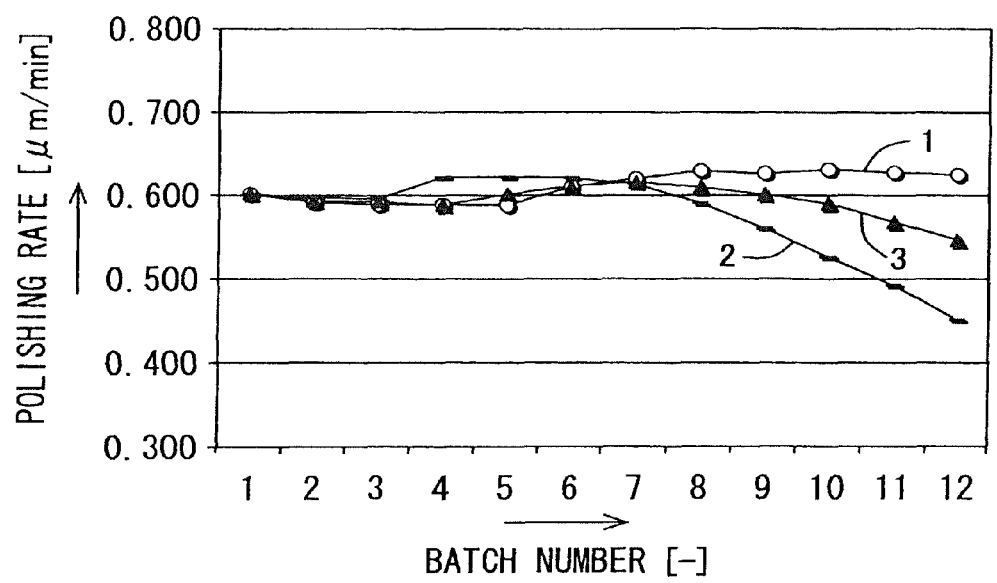
FIG. 3 is a graph showing change in polishing rate with time.

FIG. 3 is a graph showing change in polishing rate with time, wherein a vertical axis indicates a polishing rate (μm/min) and a horizontal axis indicates a batch number. A polygonal line 1 indicates Example 1, a polygonal line 2 indicates Comparative Example 1, and a polygonal line 3 indicates Comparative Example 2.

In Comparative Examples 1 and 2, the polishing rates were decreased as the batch number is increased. The decrease of the polishing rate in Comparative Example 1 was more pronounced compared to Comparative Example 2.

In Example 1, it was found that stable polishing properties were maintained without accompanying the decrease of the polishing rate. In addition, there was no polishing inhibition by alcohol such as the decrease in polishing rate caused by containing the alcohol. Although the polishing rate is slightly increased in Example 1, the increase is within measurement error.

(Quantity of Additive for Polishing Composition)

The quantities of the additive for polishing composition added for adjusting pH (for maintaining the pH at 10.6) during the polishing of the 12 batches were investigated. Results are shown in Table 1.

TABLE 1

| | Batch No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | Total |
| Example 1 | 0 | 0 | 22 | 17 | 17 | 13 | 13 | 13 | 17 | 13 | 13 | 17 | 155 |
| Comparative Example 2 | 0 | 0 | 60 | 30 | 30 | 30 | 30 | 30 | 30 | 30 | 30 | 30 | 330 |

The quantity of the additive for each of batches of Example 1 was less than that of Comparative Example 2, and a total quantity of the additive of 12 batches was 155 ml for Example 1, whereas 330 ml for Comparative Example 2. Therefore, the total quantity of the additive of Example 1 was less than a half of that of Comparative Example 2.

It was found that the quantity of the additive needed for adjusting the pH could be reduced in Example 1 because the additive used in Example 1 contained the amine compounds in high concentration, whereby the influence of the dilution of the slurry could be reduced.

(Test for Precipitation of Amine Compound)

A test for precipitation of piperazine which is an amine compound, was performed in the presence of methanol (Example 1) and in the absence of methanol (Reference Example 1).

The additives of Example 1 and Reference Example 1 were put into beakers, followed by being left at rest for seven days at liquid temperatures of 25° C., 10° C., and 5° C. The occurrence of precipitation was first visually checked and further checked by neutralization titration with hydrochloric acid. The procedure for checking by neutralization titration was as follows.

First, 5.0 g of the additive for polishing composition was taken and then diluted with pure water to prepare about 100 g of a solution. As to a sample in which the precipitation of piperazine was confirmed, a supernatant solution thereof was taken while avoiding the precipitation deposited, followed by being diluted in the same manner. The supernatant solution was then titrated with 1 mol/L hydrochloric acid solution (made by Kanto Chemical Co., Inc.) using an automatic potentiometric titrator (instrument name: AT-510 made by Kyoto Electronics Manufacturing Co., Ltd.), to obtain a titration curve. The concentration of an alkali component remaining in a sample was determined from the quantity of the hydrochloric acid consumed up to a neutralization point on the titration curve obtained.

Here, since the TMAH solution and alcohols do not precipitate at the above temperatures (10° C. and 5° C.), when changes in the quantity of the alkali component before or after leaving the liquid for seven days at each temperature, the quantity of change should be attributed to a precipitation of piperazines.

The results of the test for precipitation of amine compound are shown in Tables 2 and 3. In Table 2, "Good" indicates that piperazine does not precipitate and "Poor" indicates that piperazine precipitates. Table 3 shows relative values of quantity of the alkali component after leaving the liquid for seven days with respect to a blank value that is the quantity of the alkali component at room temperature. In Table 3, in view of a sampling error, it was decided that the precipitation of piperazine did not occur when the relative value of the quantity of the alkali component was greater than or equal to 98%.

TABLE 2

| | Liquid Temperature | | |
| --- | --- | --- | --- |
| | 25° C. | 10° C. | 5° C. |
| Example 1 | Good | Good | Good |
| Reference Example 1 | Good | Poor | Poor |

TABLE 3

| | Liquid Temperature | | |
| --- | --- | --- | --- |
| | 25° C. | 10° C. | 5° C. |
| Example 1 | 100% | 100% | 98% |
| Reference Example 1 | 100% | 86% | 65% |

In Example 1, because of inclusion of the alcohol, the precipitation of piperazines was not observed even at low liquid temperature, whereas in Reference Example 1, because of the absence of the alcohol, the precipitation of piperazine occurred at liquid temperatures of 10° C. and 5° C.

Figure 4A:
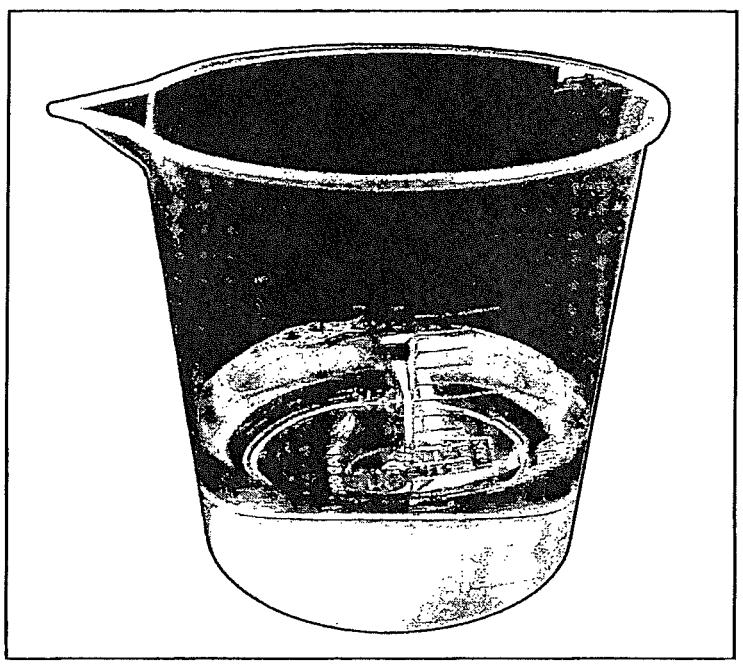
FIGS. 4A and 4B are views showing results of test for precipitation of amine compound at liquid temperature of 5° C.
Figure 4B:
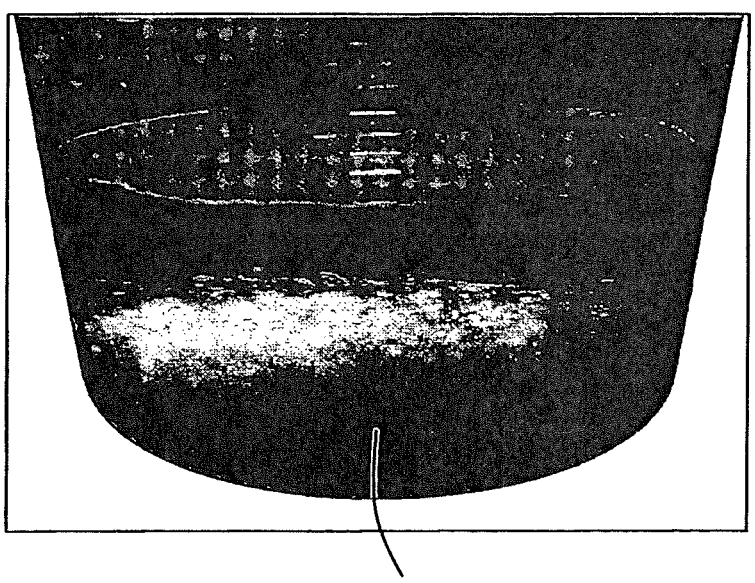

FIGS. 4A and 4B are views showing results of the test for precipitation of amine compound at liquid temperature of 5° C. FIG. 4A shows a state of Example 1 at liquid temperature of 5° C., and FIG. 4B shows a state of Comparative Example 1 at liquid temperature of 5° C. It is seen that in Example 1, the precipitate of piperazines is not observed, whereas, in Comparative Example 1, precipitated piperazine is deposited at the bottom of a beaker.

Furthermore, the same tests as described above are performed for alcohols other than methanol, i.e. ethanol, propanol and butanol. In the tests, as in the case of methanol in Example 1, the precipitation of piperazine was not observed at every liquid temperature.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to the invention, an additive for polishing composition comprises one or more amine compounds and an alcohol, the additive being added to a polishing composition used at least once.

Thereby, it is possible to prevent a decrease of polishing properties and reduce variation thereof even in a case of a cyclic usage or a multistage usage. Furthermore, even when the amine compound is contained in high concentration, the occurrence of precipitation of the amine compound can be prevented. Moreover, even when the precipitation of the amine compound occurs, the precipitate can be immediately dissolved again.

According to the invention, when the additive contains two or more amine compounds, it is preferable that the two or more amine compounds comprise a quaternary ammonium salt and one or more amine compounds selected from among soluble or water dispersible primary amine compounds, secondary amine compounds, tertiary amine compounds and polymers having amino groups in a main or side chain thereof.

According to the invention, when the additive contains two or more amine compounds, it is preferable that the amine compounds contain a quaternary ammonium salt and the same amine compound as that contained in the polishing composition.

According to the invention, it is particularly preferable that the quaternary ammonium salt is tetramethylammonium hydroxide.

According to the invention, it is preferable that the alcohol is one or more selected from among aliphatic saturated alcohols.

The invention claimed is:

1. A method of adjusting a polishing composition comprising:
    adding to a polishing composition that has been used at least once for polishing a silicon wafer, an additive that comprises two or more amine compounds, and the two or more amine compounds comprise a quaternary ammonium salt and one or more amine compounds selected from among soluble or water dispersible primary amine compounds, secondary amine compounds, tertiary amine compounds and polymers having amino groups in a main or side chain thereof and an alcohol, and further wherein the at least once used polishing composition is provided from a collection tank.

2. The method of claim 1, wherein the additive comprises two or more amine compounds, and the two or more amine compounds comprises a quaternary ammonium salt and a same amine compound as found in the polishing composition.

3. The method of claim 1, wherein the quaternary ammonium salt is tetramethylammonium hydroxide.

4. The method of claim 1, wherein the alcohol comprises one or more selected from among aliphatic saturated alcohols.

* * * * *